(12) United States Patent
Kim

(10) Patent No.: US 9,299,754 B2
(45) Date of Patent: Mar. 29, 2016

(54) ORGANIC LIGHT EMITTING DISPLAY AND MANUFACTURING METHOD THEREOF

(71) Applicant: Samsung Display Co., Ltd., Yongin, Gyeonggi-Do (KR)

(72) Inventor: Woong sik Kim, Hwaseong-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 81 days.

(21) Appl. No.: 14/029,246

(22) Filed: Sep. 17, 2013

(65) Prior Publication Data

US 2014/0151653 A1 Jun. 5, 2014

(30) Foreign Application Priority Data

Nov. 30, 2012 (KR) .................. 10-2012-0138256

(51) Int. Cl.
*H01L 27/32* (2006.01)

(52) U.S. Cl.
CPC ........ *H01L 27/3258* (2013.01); *H01L 27/3244* (2013.01); *H01L 27/3276* (2013.01)

(58) Field of Classification Search
CPC .................................. H01L 27/3258
USPC ............................ 257/40; 438/34
See application file for complete search history.

(56) References Cited

U.S. PATENT DOCUMENTS

| | | | |
|---|---|---|---|
| 7,038,239 B2 * | 5/2006 | Murakami et al. | .......... G02F 1/136227 257/350 |
| 7,375,464 B2 | 5/2008 | Chin et al. | |
| 7,679,089 B2 | 3/2010 | Tokuda et al. | |
| 7,833,570 B2 * | 11/2010 | Harkleroad et al. | ...... G03F 1/14 216/12 |
| 8,274,090 B2 | 9/2012 | Choi et al. | |
| 2007/0029545 A1 * | 2/2007 | Striakhilev et al. | . H01L 27/3248 257/40 |
| 2010/0051910 A1 * | 3/2010 | Choi | ............. H01L 27/3246 257/40 |
| 2010/0181559 A1 | 7/2010 | Nakatani et al. | |
| 2011/0198596 A1 | 8/2011 | Park | |
| 2011/0272677 A1 | 11/2011 | Takeuchi | |

FOREIGN PATENT DOCUMENTS

| | | |
|---|---|---|
| KR | 10-2010-0027150 A | 3/2010 |
| KR | 10-2011-0094460 A | 8/2011 |
| KR | 10-2012-0081660 A | 7/2012 |

* cited by examiner

*Primary Examiner* — Matthew W Such
*Assistant Examiner* — Warren H Kilpatrick
(74) *Attorney, Agent, or Firm* — Robert E. Bushnell, Esq.

(57) ABSTRACT

An organic light emitting display includes a substrate, a thin film transistor disposed on the substrate, an overcoat layer having a first thru-hole formed therethrough to expose a portion of the thin film transistor and inclined at an angle with respect to the substrate, an upper passivation layer disposed on the overcoat layer and having a second thru-hole formed thererethrough to expose the portion of the thin film transistor, a first electrode connected to the thin film transistor through the second thru-hole, a light emitting layer disposed on the first electrode, and a second electrode disposed on the light emitting layer.

12 Claims, 9 Drawing Sheets

ORGANIC LIGHT EMITTING DISPLAY AND MANUFACTURING METHOD THEREOF

CLAIM OF PRIORITY

This application makes reference to, incorporates into this specification the entire contents of, and claims all benefits accruing under 35 U.S.C. §119 from an application earlier filed in the Korean Intellectual Property Office filed on Nov. 30, 2012 and there duly assigned Serial No. 10-2012-0138256.

BACKGROUND OF THE INVENTION

1. Field of the Invention

The present invention relates to an organic light emitting display and a method of manufacturing the organic light emitting display. More particularly, the present invention relates to an organic light emitting display capable of improving the uniformity of image quality and a method of manufacturing the organic light emitting display.

2. Description of the Related Art

A flat-panel display device is classified into a light-emitting type and a light-receiving type. As the light-emitting type flat-panel display device, a flat cathode ray tube, a plasma display panel, and an electroluminescent device have been used, and as the light-receiving type flat-panel display device, a liquid crystal display has been used. Among them, the electroluminescent device has been spotlighted as a next-generation display device since the electroluminescent device has advantages, such as wide viewing angle, superior contrast ratio, fast response speed, etc. The electroluminescent device is classified into an inorganic electroluminescent device and an organic electroluminescent device according to the material used to form a light emitting layer.

The organic electroluminescent device is a self-emissive type display that emits light by electrically exciting fluorescent organic compound. The organic electroluminescent device has various advantages, e.g., low driving voltage, thinness, wide viewing angle, fast response speed, etc.

The organic electroluminescent device includes an anode electrode, a cathode electrode, and a light emitting layer formed of an organic material. The organic electroluminescent device applies positive and negative voltages to the anode and cathode electrodes, respectively, and thus holes injected from the anode electrode are transported to the light emitting layer through a hole transport layer and electrons injected from the cathode electrode are transported to the light emitting layer through an electron transport layer. The holes are recombined with the electrons in the light emitting layer to generate excitons. The excitons emit energy, which is discharged when an excited state returns thereof to a ground state, as light.

SUMMARY OF THE INVENTION

The present invention provides an organic light emitting display capable of preventing defects caused by a contraction of an overcoat layer, and a method of manufacturing the organic light emitting display.

Embodiments of the invention provide an organic light emitting display including a substrate, a thin film transistor disposed on the substrate, an overcoat layer, an upper passivation layer, a first electrode, a light emitting layer, and a second electrode. The overcoat layer includes a first thru-hole formed therethrough to expose a portion of the thin film transistor, and the first thru-hole includes a surface inclined at an angle equal to or less than about 60 degrees with respect to an upper surface of the substrate. The upper passivation layer is disposed on the overcoat layer having a second thru-hole formed therethrough to expose the portion of the thin film transistor, and a first electrode is connected to the thin film transistor through the second thru-hole. The light emitting layer is disposed on the first electrode and a second electrode is disposed on the light emitting layer.

Embodiments of the invention provide a method of manufacturing an organic light emitting display. The organic light emitting display is manufactured by forming a thin film transistor on a substrate, forming an overcoat layer on the thin film transistor having a first thru-hole formed therethrough so as to expose a portion of the thin film transistor, forming an upper passivation layer on the overcoat layer having a second thru-hole formed therethrough so as to expose the portion of the thin film transistor, forming a first electrode on the upper passivation layer to be connected to the thin film transistor, forming an organic light emitting layer on the first electrode, and forming a second electrode on the organic light emitting layer. The first thru-hole has a surface inclined at an angle equal to or less than about 60 degrees with respect to an upper surface of the substrate;

The overcoat layer is manufactured by forming the overcoat layer on the thin film transistor, exposing and developing the overcoat layer using a mask having at least two areas with different transmittance to form the first thru-hole, and curing the overcoat layer.

The mask includes a first area that transmits a light, a second area that partially transmits and partially blocks the light, and a third area that blocks the light, and the second area corresponds to the inclined surface of the overcoat layer. The mask is a slit mask or a half-tone mask.

According to the above, defects in the organic light emitting display, which are caused by the contraction of the overcoat layer, may be prevented.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
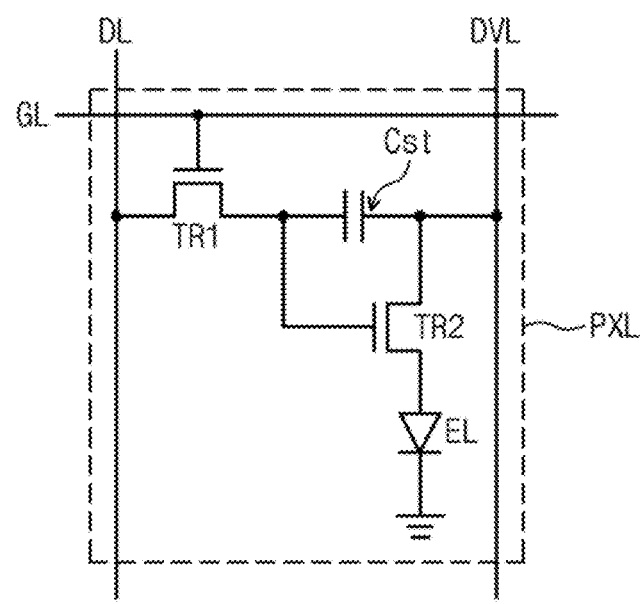
FIG. 1 is a circuit diagram showing an organic light emitting display according to an exemplary embodiment of the present disclosure.

It will be understood that, when an element or layer is referred to as being "on", "connected to" or "coupled to"

another element or layer, it can be directly on, connected to or coupled to the other element or layer, or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the", are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
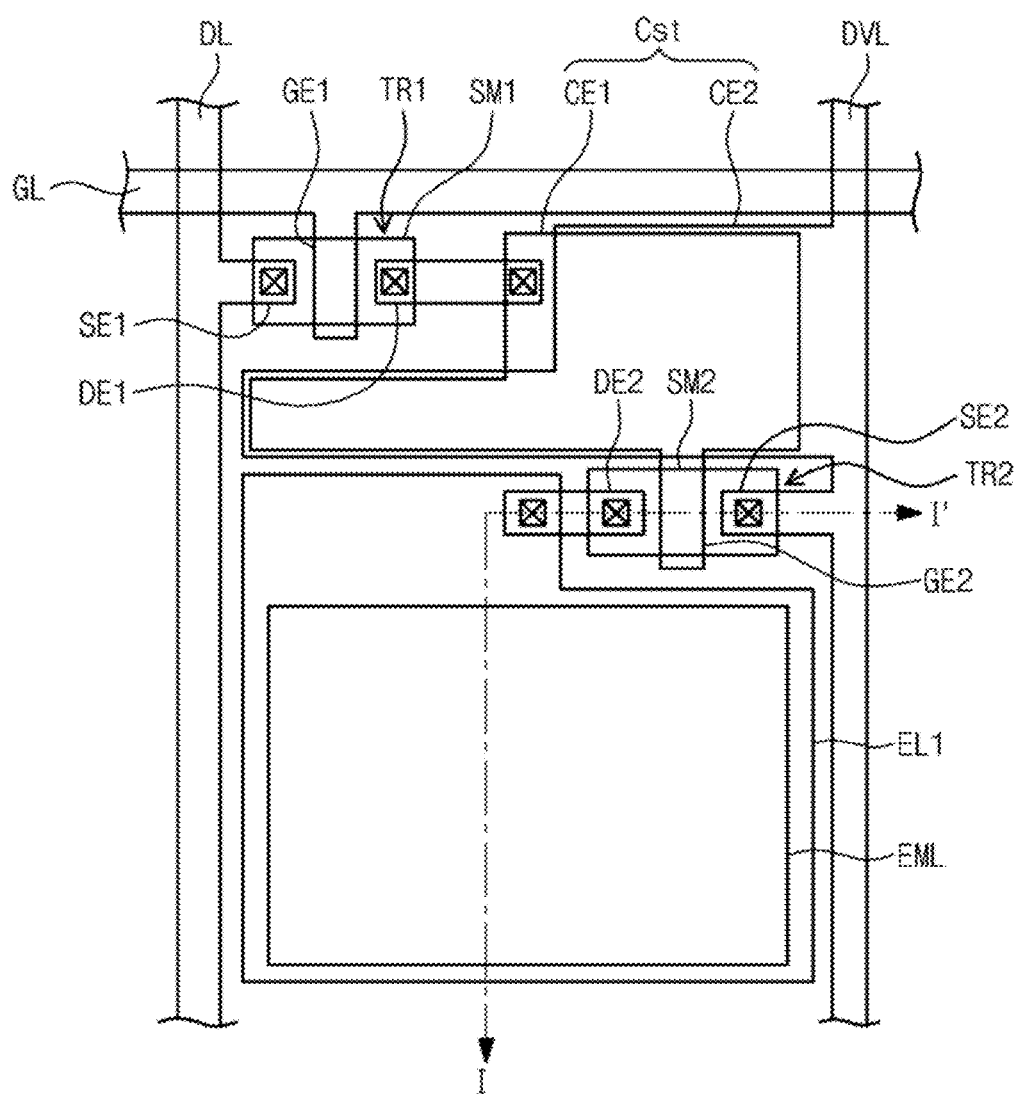
FIG. 2 is a plan view of a pixel shown in FIG. 1.
Figure 3:
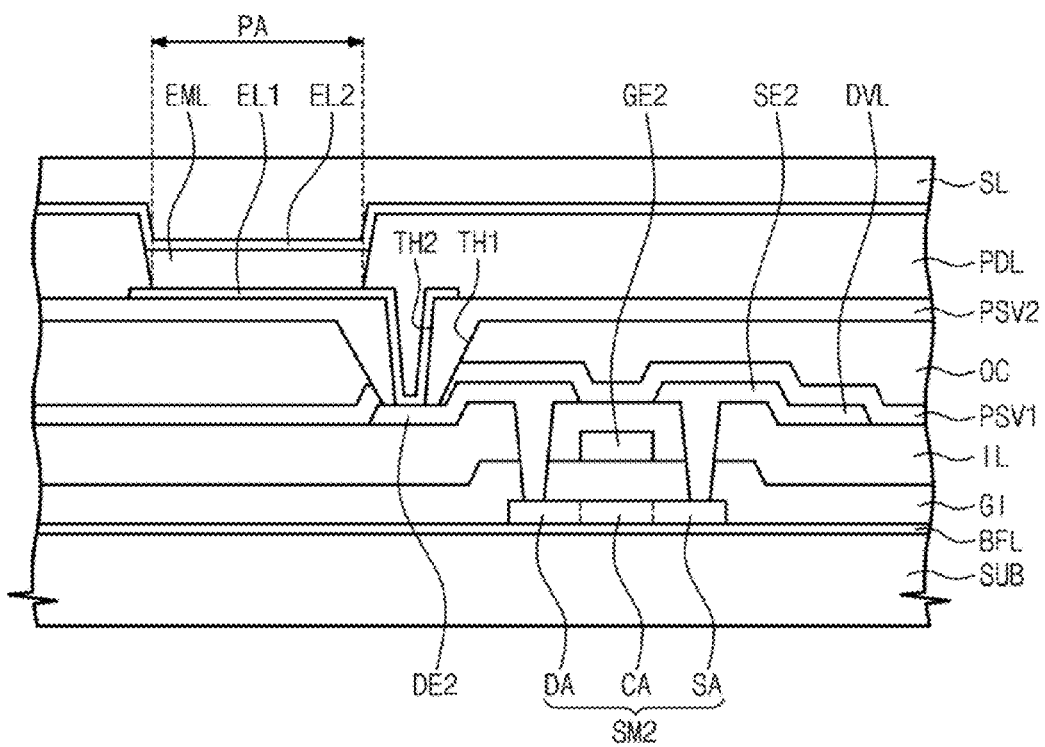
FIG. 3 is a cross-sectional view taken along a line I-I' of FIG. 2.

FIG. 1 is a circuit diagram showing an organic light emitting display according to an exemplary embodiment of the present disclosure, FIG. 2 is a plan view of a pixel of FIG. 1, and FIG. 3 is a cross-sectional view taken along a line I-I' of FIG. 2. For the convenience of explanation, the descriptions will be focused on a substrate SUB, a pixel definition layer PDL, and a pixel PXL in FIGS. 1 to 3.

Hereinafter, an organic light emitting display according to an exemplary embodiment of the present disclosure will be described with reference to FIGS. 1 to 3.

An organic light emitting display includes at least one pixel PXL on which an image is displayed. The pixel PXL is provided in plural numbers and the pixels PXL are arranged in a matrix configuration. However, for the convenience of explanation, only one pixel PXL will be shown in the present exemplary embodiment. Each pixel PXL has a rectangular shape, but it should not be limited thereto or thereby. That is, the pixel PXL may vary in shape. In addition, the pixels PXL may have different areas from each other. For instance, the pixels PXL may have different areas and shapes according to their colors.

Referring to FIG. 1, the pixel PXL includes a wiring part having a gate line GL, a data line DL, a driving voltage line DVL, a thin film transistor connected to the wiring part, an organic light emitting device EL connected to the thin film transistor, and a capacitor Cst.

The gate line GL extends in one direction. The data line DL extends in another direction substantially perpendicular to the gate line GL. The driving voltage line DVL extends in a direction substantially parallel to the data line DL. The gate line GL applies a scan signal to the thin film transistor, the data line DL applies a data signal to the thin film transistor, and the driving voltage line DVL applies a driving voltage to the thin film transistor.

The thin film transistor includes a driving thin film transistor TR2 to control the organic light emitting device EL and a switching thin film transistor TR1 to switch the driving thin film transistor TR2. In the present exemplary embodiment, one pixel PXL includes two thin film transistors TR1 and TR2, but the number of the thin film transistors should not be limited to two. That is, one pixel PXL may include one thin film transistor and one capacitor, or three or more thin film transistors and two or more capacitors.

Referring to FIG. 2, the switching thin film transistor TR1 includes a first gate electrode GE1, a first source electrode SE1, and a first drain electrode DE1. The first gate electrode GE1 is connected to the gate line GL and the first source electrode SE1 is connected to the data line DL. The first drain electrode DE1 is connected to a gate electrode (i.e., a second gate electrode GE2) of the driving thin film transistor TR2. The switching thin film transistor TR1 transmits the data signal applied to the data line DL to the driving thin film transistor TR2 in response to the scan signal applied to the gate line GL.

The driving thin film transistor TR2 includes the second gate electrode GE2, a second source electrode SE2, and a second drain electrode DE2. The second gate electrode GE2 is connected to the switching thin film transistor TR1, the second source electrode SE2 is connected to the driving voltage line DVL, and the second drain electrode DE2 is connected to the organic light emitting device EL.

The organic light emitting device EL includes a light emitting layer EML, a first electrode EL1, and a second electrode EL2 facing the first electrode EL1 while interposing the light emitting layer EML between the first and second electrodes EL1 and EL2. The first electrode EL1 is connected to the second drain electrode DE2 of the driving thin film transistor TR2. The second electrode EL2 receives a common voltage, and the light emitting layer EML emits a light in response to an output signal of the driving thin film transistor TR2 to display an image.

The capacitor Cst is connected between the second gate electrode GE2 and the second source electrode SE2 of the driving thin film transistor TR2 and is charged with the data signal applied to the second gate electrode GE2 of the driving thin film transistor TR2 to maintain the data signal applied to the second gate electrode GE2.

Hereinafter, the organic light emitting display according to the present exemplary embodiment of the present disclosure will be described with reference to FIG. 3.

The organic light emitting display includes a substrate SUB formed of an insulating material, such as glass, plastic, and crystal, on which the thin film transistor and the organic light emitting device are stacked.

A buffer layer BFL is formed on the substrate SUB. The buffer layer BFL prevents impurities from being diffused into the switching thin film transistor TR1 and the driving thin film transistor TR2. The buffer layer BFL may be formed of silicon nitride ($SiN_x$), silicon oxide ($SiO_x$), and silicon oxynitride ($SiO_xN_y$), and the buffer layer BFL may be omitted according to the material and the process condition of the substrate SUB.

A first semiconductor layer SM1 and a second semiconductor layer SM2 are provided on the buffer layer BFL. The first semiconductor layer SM1 and the second semiconductor layer SM2 are formed of a semiconductor material and serve as an active layer of the switching thin film transistor TR1 and the driving thin film transistor TR2, respectively. Each of the first and second semiconductor layers SM1 and SM2, respectively, includes a source area SA, a drain area DA, and a channel area CA provided between the source area SA and the drain area DA. Each of the first and second semiconductor layers SM1 and SM2, respectively, may be formed of an inorganic semiconductor material or an organic semiconductor material. For instance, the first and second semiconductor layers SM1 and SM2, respectively, may include oxide semiconductor, amorphous silicon semiconductor, crystalline silicon semiconductor, or polycrystalline silicon semiconductor. The oxide semiconductor includes oxide material having at least one of indium (In), gallium (Ga), zinc (Zn), and tin (Sn). For example, the first and second semiconductor layers SM1 and SM2, respectively, may include oxide semiconductor, such as zinc oxide, tin oxide, indium oxide, indium-zinc oxide, indium-tin oxide, indium-gallium-zinc oxide, indium-zinc-tin oxide, indium-gallium-zinc-tin oxide, etc. The source area SA and the drain area DA are doped with an n-type impurity or a p-type impurity.

A gate insulating layer GI is disposed on the first and second semiconductor layers SM1 and SM2.

The first gate electrode GE1 and the second gate electrode GE2 connected to the gate line GL are disposed on the gate insulating layer GI. The first gate electrode GE1 and the second gate electrode GE2 are formed to cover an area corresponding to the channel area CA of the first semiconductor layer SM1 and the second semiconductor layer SM2, respectively.

An inter-insulating layer IL is formed on the first and second gate electrodes GE1 and GE2 to cover the first and second gate electrodes GE1 and GE2.

The first source electrode SE1, the first drain electrode DE1, the second source electrode SE2, and the second drain electrode DE2 are disposed on the inter-insulating layer IL. The first source electrode SE1 and the first drain electrode DE1 make contact with the source area SA and the drain area DA, respectively, of the first semiconductor layer SM1 through contact holes formed through the gate insulating layer GI and the inter-insulating layer IL. The second source electrode SE2 and the second drain electrode DE2 respectively make contact with the source area SA and the drain area DA, respectively, of the second semiconductor layer SM2 through contact holes formed through the gate insulating layer GI and the inter-insulating layer IL.

In an exemplary embodiment of the invention, referring to FIGS. 2 and 3, a portion of the second gate electrode GE2 and a portion of the driving voltage line DVL respectively correspond to a first capacitor electrode CE1 and a second capacitor electrode CE2 to form the capacitor Cst in cooperation with the inter-insulating IL disposed between the portions of the second gate electrode GE2 and the driving voltage line DVL.

A lower passivation layer PSV1 is disposed on the first source electrode SE1, the first drain electrode DE1, the second source electrode SE2, and the second drain electrode DE2. The lower passivation layer PSV1 protects the switching and driving thin film transistors TR1 and TR2, respectively. In particular, the lower passivation layer PSV1 prevents external impurities from being diffused into the channel of the switching and driving thin film transistors TR1 and TR2, respectively.

The lower passivation layer PSV1 includes an inorganic insulating material. The lower passivation layer PSV1 may be formed of silicon nitride (SiNx), silicon oxide ($SiO_x$), silicon oxynitride ($SiO_xN_y$), etc. The lower passivation layer PSV1 may be omitted according to the material and the process condition of the substrate SUB.

An overcoat layer OC is disposed on the lower passivation layer PSV1. The overcoat layer OC serves as a planarization layer to planarize an upper surface of the substrate SUB. The overcoat layer OC includes an organic insulating material, e.g., an organic polymer material.

The overcoat layer OC and the lower passivation layer PSV1 are provided with a first thru-hole TH1 formed therethrough to expose a portion of an upper surface of the second drain electrode DE2 of the driving thin film transistor TR2. The first thru-hole TH1 is defined by an inclined surface that connects an upper surface of the overcoat layer OC and the upper surface of the second drain electrode DE2. The inclined surface is substantially in parallel with the upper surface of the substrate SUB or inclined with respect to the upper surface of the overcoat layer OC, and the inclined surface has an inclination angle from about 20 degrees to about 80 degrees. According to another exemplary embodiment, the inclined surface may have an inclination angle equal to or less than about 60 degrees, or the inclined surface may have an inclination angle equal to or less than about 50 degrees.

An upper passivation layer PSV2 is disposed on the overcoat layer OC. The upper passivation layer PSV2 thoroughly covers the overcoat layer OC. The upper passivation layer PSV2 prevents gas or impurities generated in the overcoat layer OC from being diffused into the first electrode and/or the light emitting layer.

The upper passivation layer PSV2 includes an inorganic insulating material. The upper passivation layer PSV2 may be formed of silicon nitride (SiNx), silicon oxide ($SiO_x$), silicon oxynitride ($SiO_xN_y$), etc.

The upper passivation layer PSV2 includes a second thru-hole TH2 formed therethrough to expose a portion of the upper surface of the second drain electrode DE2 of the driving thin film transistor TR2. The second thru-hole TH2 is defined by an inclined surface that connects an upper surface of the upper passivation layer PSV2 and the exposed upper surface of the second drain electrode DE2. The inclined surface is substantially in parallel with the upper surface of the substrate SUB or inclined with respect to the upper surface of the overcoat layer OC. The inclined surface has an inclination angle greater than that of the inclined surface of the overcoat layer OC.

Here, the upper surface of the second drain electrode DE2 exposed through the second thru-hole TH2 is located within the upper surface of the second drain electrode DE2 exposed through the first thru-hole TH1 and has an area smaller than the upper surface of the second drain electrode DE2 exposed through the first thru-hole TH1.

The first electrode EL1 is disposed on the upper passivation layer PSV2 as an anode of the light emitting device EL. The first electrode EL1 is connected to the second drain electrode DE2 of the driving thin film transistor TR2 through the second thru-hole TH2 formed through the upper passivation layer PSV2. The first electrode EL1 may serve as a cathode. However, in the present exemplary embodiment, the first electrode EL1 will be described as the anode.

The first electrode EL1 may be formed of a material having a higher work function. In a case where an image is provided in a lower direction of the substrate SUB, the first electrode EL1 may be formed of a transparent conductive layer, indium tin oxide (ITO), indium zinc oxide (IZO), zinc oxide (ZnO), indium tin zinc oxide (ITZO), etc. In a case where the image is provided in an upper direction of the substrate SUB, the first electrode EL1 may be formed of a metal reflective layer, e.g., Ag, Mg, Al, Pt, Pd, Au, Ni, Nd, Ir, Cr, etc. and the transparent conductive layer, e.g., ITO, IZO, ZnO, ITZO, etc.

A pixel definition layer PDL is disposed on the substrate SUB, on which the first electrode EL1 is formed to partition the pixel area PA into plural areas respectively corresponding to each pixel. The pixel definition layer PDL protrudes from the substrate SUB along the circumference of the pixel to expose an upper surface of the first electrode EL1.

The light emitting layer EML is disposed in the pixel area PA surrounded by the pixel definition layer PDL, and the second electrode EL2 is disposed on the light emitting layer EML.

The light emitting layer EML may include a light emitting material emitting a red, green, or blue color corresponding to each pixel. Pixels each emitting the red, green, or blue colors are operated as red, green, and blue color pixels corresponding to red, green, and blue pixel areas, respectively. The red, green, and blue color pixels form one main pixel. However, the color of the emitted light in each pixel, i.e., an emitting wavelength, should not be limited thereto or thereby. The pixels may emit additional colors, such as yellow and magenta colors, or one pixel may emit a white light.

The light emitting layer EML may have a single-layer structure. However, the light emitting layer EML may have a multi-layer structure of layers with different functions. For instance, the light emitting layer EML may include a hole injecting layer, a hole transport layer, a light emitting layer, an electron transport layer, and an electron injecting layer, which are sequentially stacked, and at least one of the hole injecting layer, the hole transport layer, the electron transport layer, and the electron injecting layer may be omitted.

The second electrode EL2 includes a material having a lower work function, such as metal, alloy, electric conductive compound, and a mixture thereof. For example, the second electrode EL2 includes lithium (Li), magnesium (Mg), aluminum (Al), aluminum-lithium (Al—Li), calcium (Ca), magnesium-indium (Mg—In), magnesium-silver (Mg—Ag), etc.

In an exemplary embodiment of the invention, the second electrode EL2 may be a transparent electrode or a reflective electrode. In the case where the second electrode EL2 is a transparent electrode, the second electrode EL2 includes the transparent conductive materials. In addition, in the case where the second electrode EL2 is a reflective electrode, the second electrode EL2 includes the metal reflective layer. A sealant layer SL is disposed on the second electrode EL2 to cover the second electrode EL2.

Hereinafter, a method of manufacturing the organic light emitting display will be described with reference to FIGS. 4A to 4D which are cross-sectional views sequentially showing the method of manufacturing the organic light emitting display according to an exemplary embodiment of the present disclosure. For convenience of explanation, some parts of the organic light emitting display, e.g., the thin film transistor, will be briefly described or omitted.

Figure 4A:
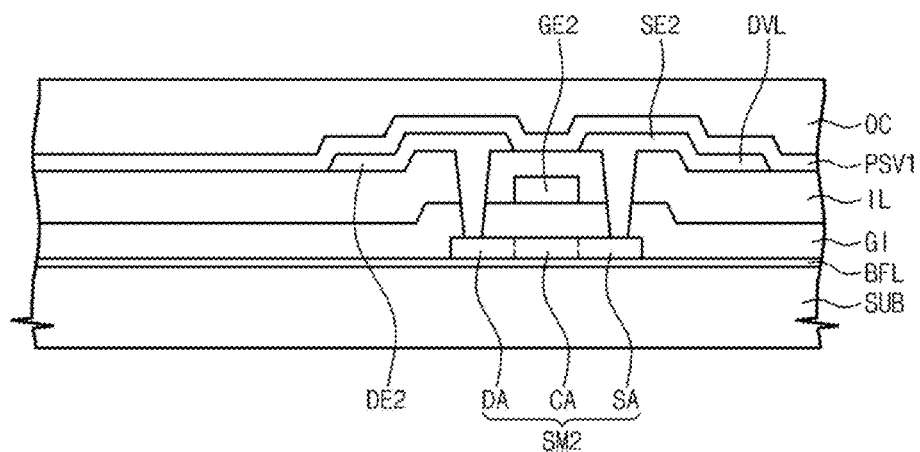
FIGS. 4A to 4D are cross-sectional views showing a method of manufacturing an organic light emitting display according to an exemplary embodiment of the present disclosure.

Referring to FIG. 4A, the wiring part, the switching thin film transistor TR1, and the driving thin film transistor TR2 are formed on the substrate SUB. FIG. 4A shows the gate line and the driving voltage line of the wiring part, and the second gate electrode GE2, the second semiconductor layer SM2, the second source electrode SE2, and the second drain electrode DE2 of the driving thin film transistor TR2.

The lower passivation layer PSV1 is formed on the switching thin film transistor TR1 and the driving thin film transistor TR2. The lower passivation layer PSV1 is formed by depositing inorganic insulating material.

The overcoat layer OC is formed on the lower passivation layer PSV1. The overcoat layer OC is formed of organic insulating material, e.g., a photosensitive organic material. When the overcoat layer OC is formed of the photosensitive organic material, the overcoat layer OC is easily patterned by exposure and development process. The overcoat layer OC is formed on the lower passivation layer PSV1 through a coating method or an inkjet method.

Figure 4B:
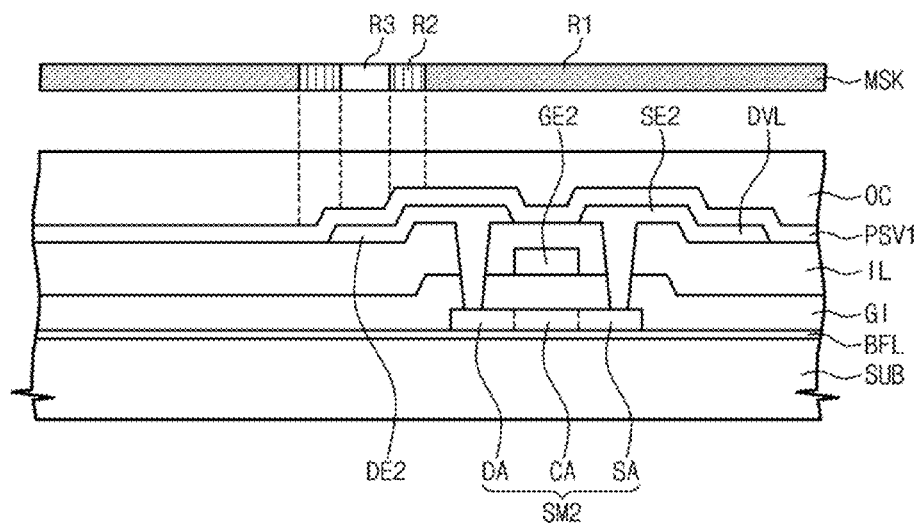

Referring to FIG. 4B, the overcoat layer OC is exposed and developed using a mask MSK. The mask MSK is a slit mask or a half-tone mask that includes a first area R1 to block all irradiated light, a second area R2 employing a slit pattern or a half-tone pattern to partially transmit and partially block the irradiated light, and a third area R3 to transmit all the irradiated light.

The overcoat layer OC includes a first area, a second area, and a third area corresponding to the first area R1, the second area R2, and the third area R3 of the mask MSK, respectively.

Figure 4C:
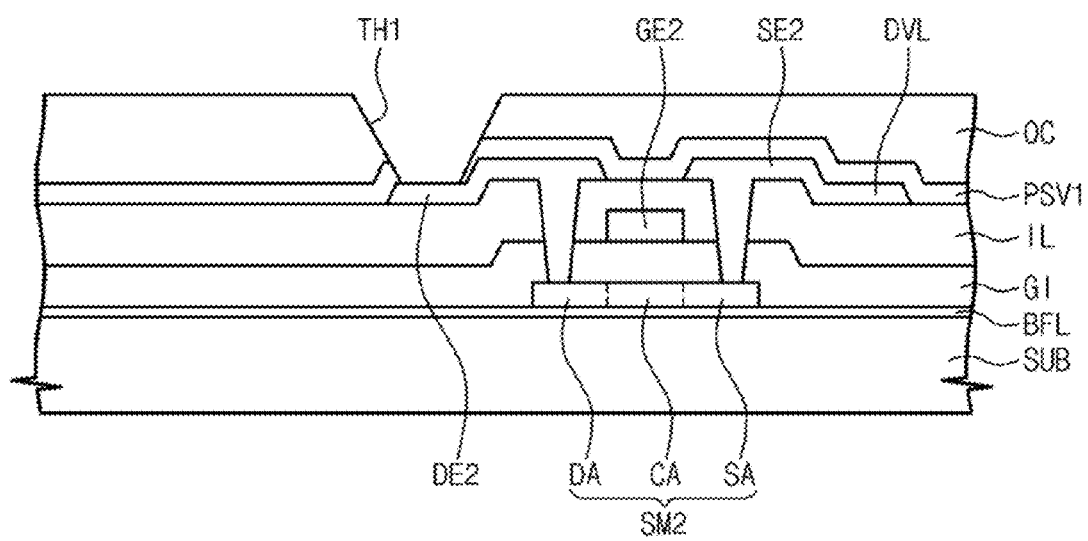

After the overcoat layer OC is exposed and developed using the mask MSK, as shown in FIG. 4C, the overcoat layer OC remains in the first area corresponding to area R1 of mask MSK, and the overcoat layer OC is completely removed from the third area corresponding to area R3 of mask MSK. In the present exemplary embodiment, the overcoat layer OC is formed of a positive type photosensitive material such that the exposed portion of the overcoat layer OC is removed, but it should not be limited thereto or thereby. That is, the overcoat layer OC may be formed of a negative type photosensitive material so as to remove a portion of the overcoat layer OC, which is not exposed.

Then, the lower passivation layer PSV1 is etched using the overcoat layer OC as a mask to expose the upper surface of the second drain electrode DE2 of the driving thin film transistor TR2. As a result, the first thru-hole TH1 is formed through the overcoat layer OC and the lower passivation layer PSV1 to expose the upper surface of the second drain electrode DE2. After the exposure and development process is performed on the overcoat layer OC, the overcoat layer OC is cured at high temperature. Here, the first thru-hole TH1 is formed by applying a photolithography process using one slit mask or one diffraction mask on the overcoat layer OC and the lower passivation layer PSV1, but it should not be limited thereto or thereby. For instance, the first thru-hole TH1 may be formed by a photolithography process using two masks. In detail, a thru-hole is formed through the lower passivation layer PSV1 using one mask, and then the overcoat layer OC is formed on the lower passivation layer PSV1. After that, the overcoat layer OC formed on the lower passivation layer PSV1 is patterned using the slit mask or the diffraction mask to complete the first thru-hole TH1. As a result, the first thru-hole TH1 is formed through the overcoat layer OC and the lower passivation layer PSV1 using two masks.

Since the overcoat layer OC in the second area R2 partially transmits light when exposed to the irradiated light, the overcoat layer OC in the second area R2 has the inclined surface formed by removing the portion thereof. The inclination angle of the overcoat layer OC is controlled by adjusting the pattern of the mask. When the slit mask is used, an amount of the light exposed to the overcoat layer OC may be controlled by adjusting the width of the slit or the number of slits. In addition, when the overcoat layer OC is cured, the inclination angle of the overcoat layer OC after being cured is smaller than the inclination angle of the overcoat layer OC before being cured since the overcoat layer OC moves due to the high temperature during the curing process. Thus, the inclination angle of the overcoat layer OC is controlled in consideration of the decrease in the inclination angle during the curing process.

The inclination angle of the overcoat layer OC is equal to or less than about 80 degrees, or equal to or less than about 60 degrees. Also, the inclination angle of the overcoat layer OC is equal to or greater than about 25 degrees.

Figure 4D:
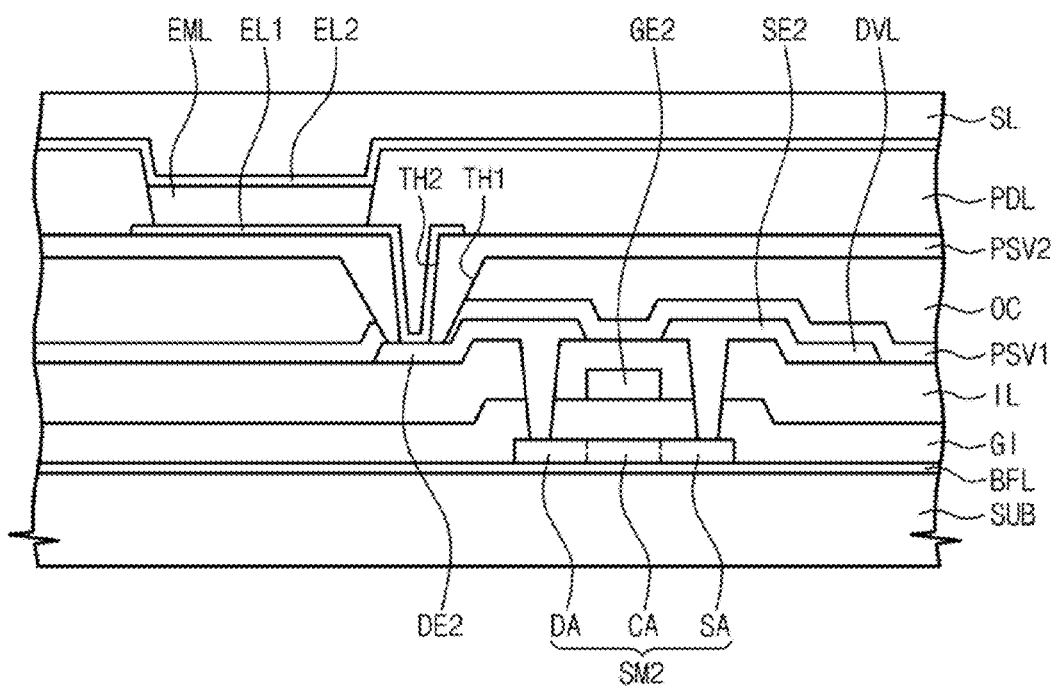

As shown in FIG. 4D, the upper passivation layer PSV2 is formed on the overcoat layer OC. The upper passivation layer PSV2 is formed by depositing inorganic insulating material. Then, the second thru-hole TH2 is formed through the upper passivation layer PSV2 by a photolithography process to expose the portion of the upper surface of the second drain electrode DE2. The second thru-hole TH2 is formed within the area where the first thru-hole TH1 is formed so as to have an area smaller than the first thru-hole TH1, and thus the overcoat layer OC is not exposed.

The first electrode EL1 and the pixel definition layer PDL are formed on the upper passivation layer PSV2. The first electrode EL1 is formed by depositing a conductive material on the substrate SUB on which the wiring part and the thin film transistors are formed and patterning through a photolithography process. The pixel definition layer PDL is formed by forming the photosensitive organic layer on the substrate SUB on which the first electrode EL1 is disposed, patterning by a photolithography process using the mask, and curing.

The light emitting layer EML is formed on the first electrode ELL The light emitting layer EML is provided on the substrate SUB in a fluid form through a printing method, a depositing method, a thermal transfer method, etc. The printing method includes an inkjet method and a coating method using a nozzle.

In the case where the light emitting layer EML is formed so as to have a multi-layer structure, each layer is formed by various methods, e.g., a slit coating method, a printing method, a vacuum depositing method, a spin coating method, a cast method, an LB method, etc.

Then, the second electrode EL2 is formed on the substrate SUB on which the light emitting layer EML is formed, and the sealant layer SL that covers the second electrode EL2 is formed to complete the organic light emitting display.

In the organic light emitting display having the above-stated structure, defects in the organic light emitting display caused by the contraction of the overcoat layer OC are prevented. In case where the inclination angle of the overcoat layer OC in the first thru-hole TH1 is excessively large, the upper passivation layer PSV2 does not entirely cover the overcoat layer OC when the upper passivation layer PSV2 is formed, thereby causing the defects. Since the overcoat layer OC is formed of the organic insulating material, e.g., an organic polymer, an additional contraction may occur during subsequent processes, such as, a process of forming the first electrode E1, a process of forming the pixel definition layer PDL, etc. In particular, during the processes performed at high temperature after the overcoat layer OC is formed, elements formed on the overcoat layer OC, such as the upper passivation layer PSV2, the first electrode EL1, etc., may be cracked or damaged due to the contraction of the overcoat layer OC. When the cracks or damages occur, the pixel may not be operated. Although the pixel is operated, additional malfunctions may occur on the pixel because the first electrode EL1 is damaged by gases generated in the overcoat layer.

Figure 5A:
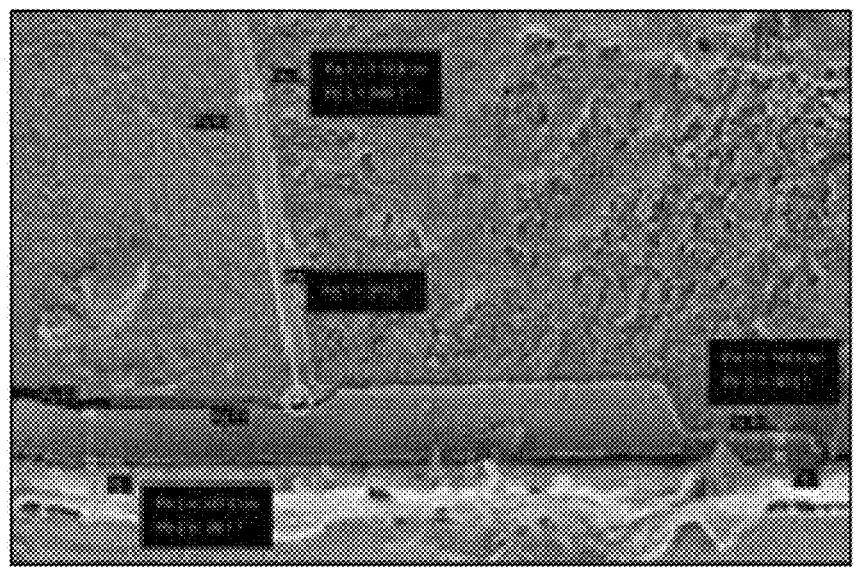
FIG. 5A is a photograph showing an overcoat layer according to a conventional organic light emitting display.
Figure 5B:
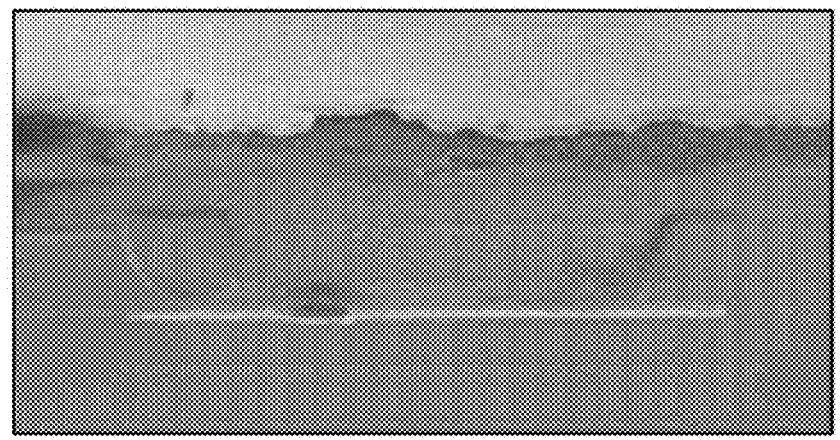
FIG. 5B is a photograph showing the overcoat layer with an upper passivation layer and a first electrode formed thereon in the conventional organic light emitting display.

In the present exemplary embodiment, the overcoat layer OC in the first thru-hole TH1 has a small inclination angle, and thus the overcoat layer OC is completely covered by the upper passivation layer PSV2. Thus, although gases are generated from the overcoat layer OC, the gases are blocked by the upper passivation layer PSV2. In addition, since the overcoat layer OC has the small inclination angle, the degree of contraction is smaller as compared to that when the overcoat layer OC has a relatively greater inclination angle, thereby reducing influence exerted on the upper passivation layer PSV2 and the first electrode ELL FIG. 5A is a photograph showing an overcoat layer in a conventional organic light emitting display and FIG. 5B is a photograph showing the overcoat layer with an upper passivation layer and a first electrode formed thereon in a conventional organic light emitting display. In the conventional organic light emitting display, the overcoat layer is formed by using a mask only including a light transmitting area and a light blocking area. Referring to FIGS. 5A and 5B, an inclination angle of the overcoat layer is equal to or greater than about 80 degrees. That is, the inclination angle is close to a right angle. As shown in FIGS. 5A and 5B, cracks occur on the overcoat layer when the upper passivation layer and the first electrode are formed on the overcoat layer.

Figure 6A:
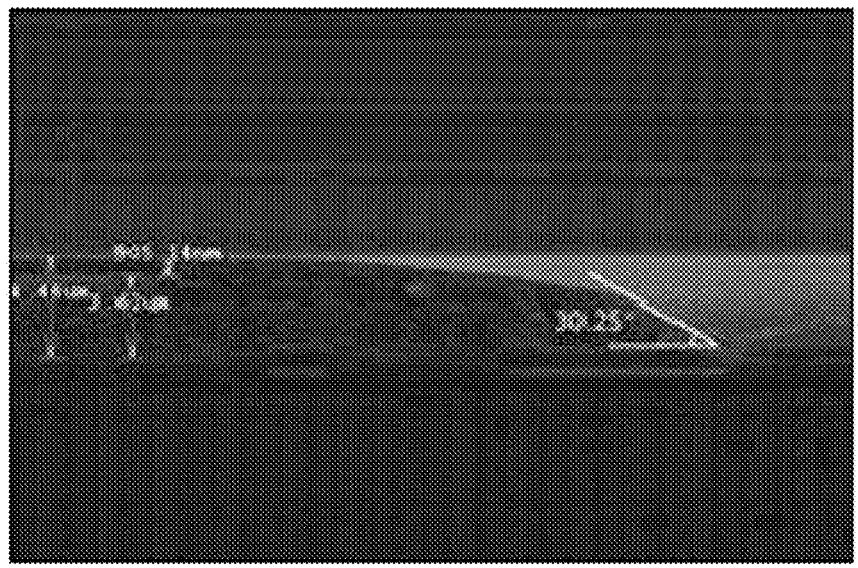
FIGS. 6A to 6D are photographs showing an overcoat layer of an organic light emitting display according to an exemplary embodiment of the present disclosure.
Figure 6B:
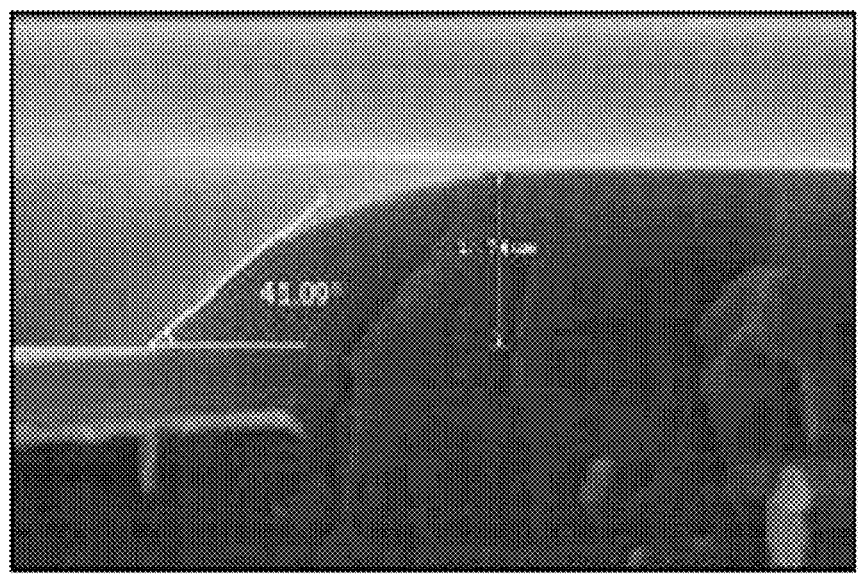
Figure 6C:
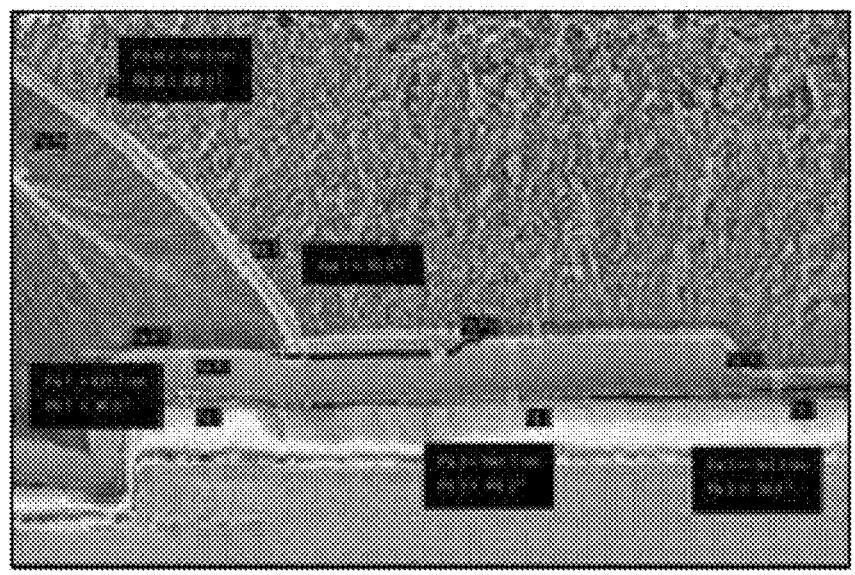
Figure 6D:
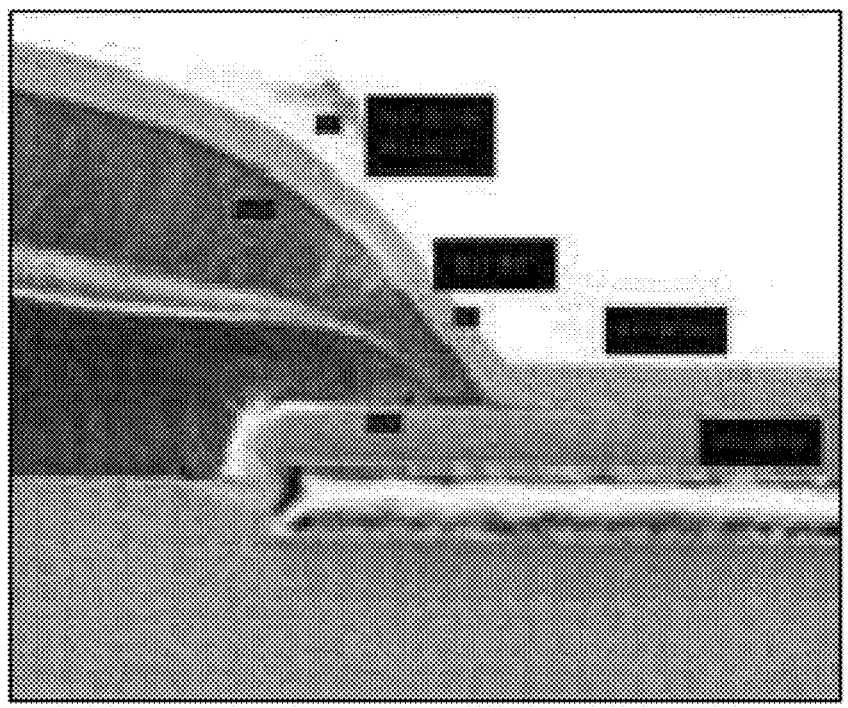

FIGS. 6A, 6B, 6C, and 6D are photographs showing the overcoat layer of the organic light emitting display according to an exemplary embodiment of the present invention. In FIGS. 6C and 6D, the overcoat layer has been shown together with the upper passivation layer formed thereon.

As shown in FIGS. 6A to 6D, the overcoat layer according to the present exemplary embodiment has a smaller inclination angle as compared to that of the overcoat layer in the conventional organic light emitting display. Therefore, as shown in FIGS. 6C and 6D, no cracks occur on the upper passivation layer formed on the overcoat layer.

Although exemplary embodiments of the present invention have been described, it is to be understood that the present invention should not be limited to these exemplary embodiments but various changes and modifications can be made by one of ordinary skill in the art within the spirit and scope of the present invention as hereinafter claimed.

What is claimed is:

1. A method of manufacturing an organic light emitting display, comprising the steps of:
   forming a thin film transistor on a substrate;
   forming an overcoat layer on the thin film transistor including a first thru-hole formed therethrough to expose a portion of the thin film transistor, the first thru-hole having a first surface inclined at a first angle not greater than 60 degrees with respect to an upper surface of the substrate;
   forming an upper passivation layer on the overcoat layer including a second thru-hole formed therethrough to expose the portion of the thin film transistor, the second thru-hole having a second surface inclined at a second angle greater than the first angle with respect to the upper surface of the substrate, wherein a distance from the first surface to the second surface in a direction parallel to the upper surface of the substrate is more increased far away from the upper surface of the substrate;

forming a first electrode on the upper passivation layer so as to be connected to the thin film transistor;

forming an organic light emitting layer on the first electrode; and forming a second electrode on the organic light emitting layer.

2. The method of claim 1, the step of forming the overcoat layer comprising:

forming the overcoat layer on the thin film transistor;

exposing and developing the overcoat layer using a mask having at least two areas with different transmittance to form the first thru-hole; and curing the overcoat layer.

3. The method of claim 2, the mask comprising a first area that transmits a light, a second area that partially transmits and partially blocks the light, and a third area that blocks the light, the second area corresponding to the first inclined surface of the first thru-hole of the overcoat layer.

4. The method of claim 3, the mask comprising a slit mask.

5. The method of claim 3, the mask comprising a half-tone mask.

6. The method of claim 1, further comprising the step of forming a lower passivation layer on the thin film transistor prior to forming the overcoat layer.

7. The method of claim 6, further comprising the step of forming a third thru-hole through the lower passivation layer to expose the portion of the thin film transistor.

8. The method of claim 7, the third thru-hole being formed through a same process as the first thru-hole.

9. The method of claim 1, the upper passivation layer completely covering the overcoat layer.

10. An organic light emitting display, comprising:

a substrate;

a thin film transistor disposed on the substrate;

an overcoat layer having a first thru-hole formed therethrough to expose a portion of the thin film transistor, the first thru-hole including a first surface inclined at a first angle not greater than 60 degrees with respect to an upper surface of the substrate;

an upper passivation layer disposed on the overcoat layer and having a second thru-hole formed therethrough to expose the portion of the thin film transistor, the second thru-hole having a second surface inclined at a second angle greater than the first angle with respect to the upper surface of the substrate wherein a distance from the first surface to the second surface in a direction parallel to the upper surface of the substrate is more increased far away from the upper surface of the substrate;

a first electrode connected to the thin film transistor through the second thru-hole;

a light emitting layer disposed on the first electrode; and a second electrode disposed on the light emitting layer.

11. The organic light emitting display of claim 10, the portion of the thin film transistor exposed through the second thru-hole being disposed within the portion of the thin film transistor exposed through the first thru-hole.

12. The organic light emitting display of claim 10, further comprising a lower passivation layer disposed on the thin film transistor and the overcoat layer.

\* \* \* \* \*